(12) United States Patent
Passlack et al.

(10) Patent No.: US 7,202,182 B2
(45) Date of Patent: Apr. 10, 2007

(54) METHOD OF PASSIVATING OXIDE/COMPOUND SEMICONDUCTOR INTERFACE

(75) Inventors: Matthias Passlack, Chandler, AZ (US); Nicholas Medendorp, Raleigh, NC (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/882,482

(22) Filed: Jun. 30, 2004

(65) Prior Publication Data

US 2006/0003595 A1    Jan. 5, 2006

(51) Int. Cl.
*H01L 21/31* (2006.01)
*H01L 21/469* (2006.01)

(52) U.S. Cl. .................. 438/758; 438/590; 257/21.213

(58) Field of Classification Search ................. 438/758, 438/930, 590, 591; 257/E21.213, E21.697
See application file for complete search history.

(56) References Cited

U.S. PATENT DOCUMENTS

| | | | |
|---|---|---|---|
| 5,696,023 A * | 12/1997 | Holonyak et al. | 438/767 |
| 6,025,281 A | 2/2000 | Passlack et al. | |
| 6,030,453 A | 2/2000 | Passlack et al. | |
| 6,159,834 A | 12/2000 | Yu et al. | |
| 2003/0137018 A1 | 7/2003 | Passlack et al. | |
| 2003/0186475 A1 * | 10/2003 | Ueda et al. | 438/22 |
| 2003/0221496 A1 * | 12/2003 | Cross et al. | 73/865.8 |
| 2004/0058557 A1 * | 3/2004 | Eisele et al. | 438/769 |
| 2004/0065887 A1 * | 4/2004 | Sato et al. | 257/79 |
| 2005/0029531 A1 * | 2/2005 | Nakayama et al. | 257/94 |

* cited by examiner

*Primary Examiner*—Caridad Everhart
(74) *Attorney, Agent, or Firm*—Ingrassia Fisher & Lorenz

(57) ABSTRACT

The present invention provides a method of passivating an oxide compound disposed on a III-V semiconductor substrate. The method is intended for use with dielectric stacks, gallate compounds, and gallium compounds used in gate quality oxide layers. The method includes heating a semiconductor structure at an elevated temperature of between about 230° C. and about 400° C. The semiconductor structure is exposed to an atmosphere that is supersaturated with water vapor or vapor of deuterium oxide. The exposure takes place at elevated temperature and continues for a period of time between about 5 minutes to about 120 minutes. It has been found that the method of the present invention results in a semiconductor product that has significantly improved performance characteristics over semiconductors that are not passivated, or that use a dry hydrogen method of passivation.

19 Claims, 2 Drawing Sheets

METHOD OF PASSIVATING OXIDE/COMPOUND SEMICONDUCTOR INTERFACE

FIELD OF THE INVENTION

The present invention relates to a method of passivating an oxide-III/V semiconductor interface. More particularly, the invention relates to the usage of vapor of water ($H_2O$) or deuterium oxide ($D_2O$) to passivate the interface between a gate oxide such as a $Ga_2O_3$ based dielectric stack and a semiconductor epitaxial layer.

BACKGROUND OF THE INVENTION

Oxide-semiconductor interfaces have a wide application in many aspects of the semiconductor industry. Recently, the demand has also grown for III-V semiconductors in high volume applications such as wireless and fiber optic communications. This has sparked increased interest in III-V based metal-oxide semiconductor (MOS) field effect transistors (FET). This increased demand has in turn focused research on surmounting previous technical limitations and manufacturing difficulties encountered with III-V MOSFET applications.

The requirements for gate quality oxide-semiconductor interfaces are numerous. In one aspect of semiconductor manufacture, there are competing demands. It is desired to "passivate" the interface between an oxide and a semiconductor. However, it is simultaneously desired that the passivation step not unduly affect the trap density at a given trap energy in the final product. Thus it is desired to develop manufacturing methods for oxide/III-V semiconductor structures that simultaneously achieve an effective interface passivation while reducing or maintaining oxide trap density levels.

Previously, gallium based MOS structures have encountered technical limitations due to high trap density. Trap density has been so high that in MOSFET applications the semiconductor could not function. Thus it would be desired to find a method of treating III-V type MOS structures so as to reduce both interface and oxide trap density.

In prior art thermal silicon dioxide MOS structures with silicon as the semiconductor substrate, oxide-semiconductor interface passivation is achieved using an atmosphere infused with dry hydrogen ($H_2$) or hydrogen's isotope, deuterium. Prior art further describes effective passivation of $Ga_2O_3$/GaAs interfaces using dry hydrogen or deuterium generated by a plasma (U.S. Pat. No. 6,025,281). However, it has been learned that dry hydrogen or deuterium do not function well with $Ga_2O_3$ based dielectric stacks on III-V semiconductors. For example, oxide-semiconductor structures that use GdGaO/$Ga_2O_3$ dielectric stacks on GaAs are not well treated by prior art methods. Although a dry hydrogen passivation of such materials efficiently reduces the $Ga_2O_3$/GaAs interface trap density, such prior art technique damages the oxide and increases the oxide trap density resulting in a substantial increase of the total trap density, thus rendering the materials unsuitable. Thus, it is also desired to discover new materials for passivation operations.

Hence there is a need to develop a new passivation method that yields improved results and is relatively inexpensive to use. It would be desired to develop a new passivation method that is directed to gate dielectric stacks on III-V semiconductors comprising gallium oxide, gallate layers and/or combinations thereof. It would be further desired to develop a new passivation method that is directed to gate dielectric stacks on III-V semiconductors which reduces the trap density at the oxide/III-V semiconductor interface while reducing or maintaining the oxide trap density. It would further be advantageous if the new passivation method employed existing processing hardware and equipment that is used in semiconductor manufacturing processes. The present invention addresses one or more of these needs.

BRIEF DESCRIPTION OF THE DRAWINGS

The present invention will hereinafter be described in conjunction with the following drawing figures, wherein like numerals denote like elements, and wherein.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
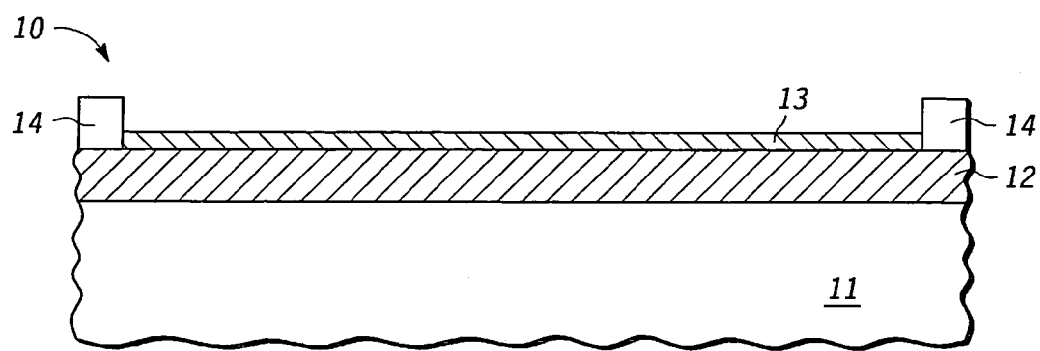
FIG. 1 is a schematic of a semiconductor interface that may be passivated according to an embodiment of the present invention.

There is shown in FIG. 1 a diagram of a semiconductor structure 10. The structure of this type may be subjected to the vapor passivation method described further herein. The structure illustrated may be only a part of a larger semiconductor structure with other parts not shown. A semiconductor structure of this type may, for example, be part of a larger III-V semiconductor which may, in turn, comprise part of a larger MOSFET semiconductor structure. It includes a substrate 11, an epitaxial layer 12, and a dielectric stack 13. Optionally present are ohmic contacts 14.

The dielectric stack 13 that is disposed on the substrate may be characterized as a gate oxide. In one preferred embodiment, dielectric stack 13 comprises a gallium compound such as gallium oxide ($Ga_2O_3$). As a further alternative, dielectric stack 13 may comprise a gallate compound. In still a further embodiment, dielectric stack 13 comprises both gallium and gallate compounds, one such structure being a GdGaO/$Ga_2O_3$ dielectric stack. Gallate and gallium compounds of all stoichiometries may be included in the semiconductor structure 10 that is part of the method herein. Further, gate oxide layers that include both gallate and gallium compounds may comprise varying stoichiometries and amounts of the materials provided they function as a dielectric stack.

The invention is directed to semiconductor structures of III-V materials. It is thus within the scope of the invention to include GaAs based epitaxial semiconductor structures as the III-V substrate 11. In one embodiment, the method of the present invention is applied to a multilayer semiconductor structure comprising a III-V substrate, an epitaxial layer deposited on one side of the III-V substrate, and a gallate/gallium oxide layer on one side of the epitaxial layer. Further the method may be applied where the gallate/gallium oxide layer comprises a GdGaO/$Ga_2O_3$ dielectric stack wherein the gallate compound may have gadolinium and gallium in differing stoichiometries.

According to an embodiment of the invention, a semiconductor structure of the type shown in FIG. 1 is subjected to a passivation step, also called an annealing step. In this step the semiconductor structure is exposed to an atmosphere including a vapor of water or deuterium oxide. The atmosphere may otherwise comprise the atmosphere of air. In one embodiment, the atmosphere is saturated with respect to the vapor. Preferably, the vapor and atmosphere are highly purified such as used in semiconductor fabrication. If needed a carrier gas such as oxygen, argon, or air, may direct the vapor to the semiconductor structure 10. In one embodiment, both the temperature of the semiconductor structure 10 and the vapor atmosphere are maintained at an elevated temperature. The temperature range is between approximately 230° C. and approximately 400° C. A temperature range of between approximately 270° C. and approximately 320° C. is preferred. Additionally, the time of exposure is between approximately 5 to approximately 120 minutes, with a time of approximately 20 to approximately 40 minutes being preferred. The time and temperature of the vapor exposure may be adjusted depending on the thickness of the dielectric stack 13 to receive the passivation step. Generally, thicker dielectric stacks 13 may benefit from increased time and/or temperature of exposure.

Figure 2:
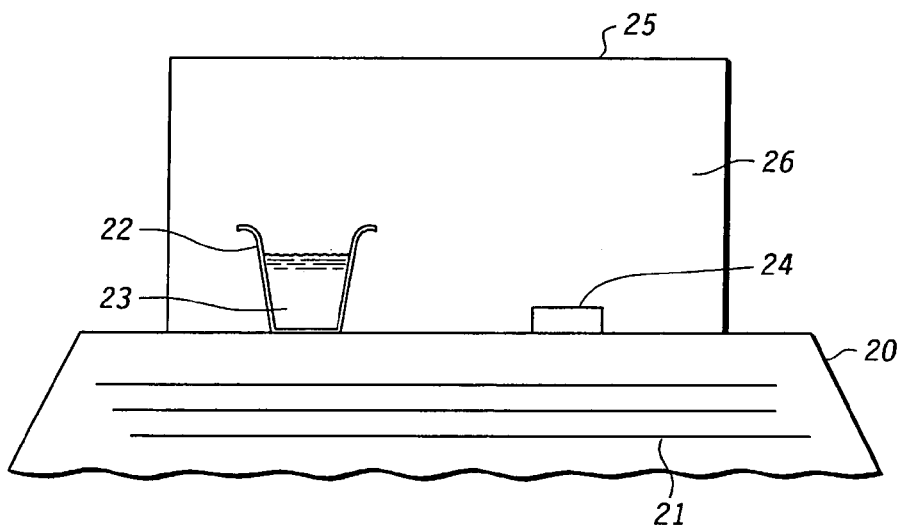
FIG. 2 is a schematic of an apparatus used to practice the passivation method according to an embodiment of the present invention.

Referring now to FIG. 2 there is shown a schematic of an apparatus that may be used to practice an embodiment of the passivation method. A heat source 20 comprises a structure to provide heat. One type of heat source 20 is a hot plate. Heat source 20 may include heating coils 21. A water source 22 provides a source of water. A beaker or vessel is one kind of water source 22. In the illustrated embodiment water source 22 provides or holds water 23. Preferably water 23 is a high purity, deionized water. Semiconductor structure 10 is positioned proximate to water source 22 and also in proximity to heat source 20. Enclosure 25, which may comprise for example an enclosed reactor hood, surrounds water source 22 and semiconductor structure 10. As shown, enclosure 25 contacts heat source 20. Enclosure 25 thus creates an enclosed space around water source 22 and semiconductor structure 10. However, enclosure 25 need not create an airtight seal with heat source 20. As heat source 20 provides heat, the system allows for excess pressure to escape from enclosure 25, and one way of accomplishing that is to allow a degree of fluid communication from the interior of enclosure 25 to the exterior where there is contact with heat source 20.

In operation, heat source 20 is activated so that it begins to provide heat. If, for example, heating coils 21 are present, an electric current may be passed through them to provide heat. By creating heat, heat source 20 begins to heat both water source 22 and semiconductor structure 10. In a preferred embodiment, heat source 20 continues to gradually heat these items until semiconductor structure 10 reaches a steady temperature between approximately 230° C. and approximately 400° C. As is understood in manufacturing techniques, the temperature may correspond to the temperature of the ambient such that the structure is heated at that temperature. As water source 22 is heated above 100° C., water 23 begins to vaporize. The water vapor expands into the volume defined by enclosure 25. Preferably the production of water vapor continues within enclosure 25 until the atmosphere therein reaches a supersaturated state with respect to the water vapor. The atmosphere within enclosure 25 may comprise, other than water vapor, air.

The gaseous water vapor thereupon migrates until it comes into contact with the surface of dielectric stack 13 of semiconductor structure 10. While not wishing to be bound by any particular chemical theory, the following discussion is further provided to explain the possible function of the passivation method. When molecules of water vapor contact the surface of dielectric stack 13 of semiconductor structure 10, the water molecules dissociate into hydroxyl groups (—$OH^-$) and hydrogen ($H^+$). The hydroxyl groups and hydrogen atoms further migrate and diffuse into and through the dielectric stack 13 towards the oxide-semiconductor interface. It is theorized that the hydroxyl components may react with various oxygen or metal components of the oxide structure thereby removing defects from the oxide structure, further compensating the reducing and defect creating effect of hydrogen in metal oxides and thus effectively lowering the total oxide trap density. It is known, for example, that defects in the bond structure of metals and oxygen atoms within the oxide amorphous network structure give rise to trap locations. Thus, it is believed that the hydroxyl ions interact with atomic-defects in some manner so as to eliminate oxide traps. Simultaneously, hydrogen is delivered to the oxide-semiconductor interface passivating interface defects and lowering interface trap density. Thus, the combination of hydroxyl groups and hydrogen atoms removes both oxide and interface defects, and the total trap density of semiconductor structure 10 is lowered.

In an alternative embodiment, deuterium oxide is substituted for water 23. As with water, deuterium oxide used as an annealing agent is preferably high purity and deionized. Deuterium is a stable, naturally-occurring isotope of hydrogen with an atomic mass of two (one proton and one neutron). There is approximately 1 part of deuterium to 5000 parts of normal hydrogen found in nature. Deuterium is sometimes called heavy hydrogen. When combined with oxygen, the oxide form is referred to as heavy water. It is also within the scope of the invention to use both water vapor and vapor of deuterium oxide in combination as the annealing vapor.

Figure 3:
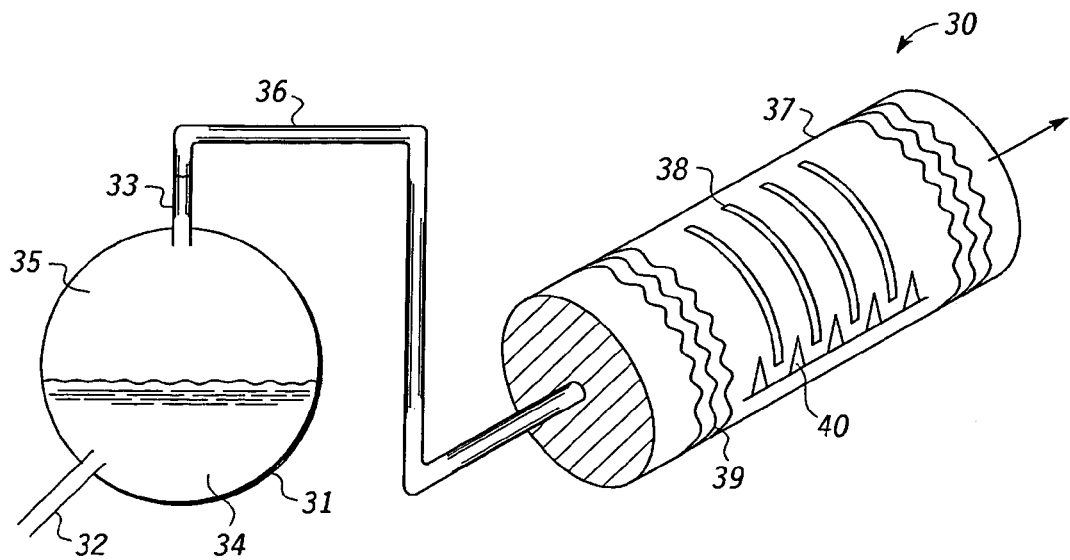
FIG. 3 is a schematic of an industrial-type apparatus used to practice the passivation method according to an embodiment of the present invention.

An alternative embodiment of the passivation method, an embodiment that may be more suited to industrial semiconductor fabrication methods, is now described. Referring to FIG. 3 there is shown an apparatus 30 that may be used with the alternative passivation method. This apparatus 30 comprises a vapor source 31. Vapor source 31 provides a means to generate a vapor that is used to passivate the target semiconductor. In a preferred embodiment vapor source 31 is an enclosed vessel with an interior region and an exterior. A "bubbler" is one kind of vapor source 31. A heating means, not shown, directs heat onto vapor source 31. A heating means may comprise heating coils or an oven.

Preferably vapor source 31 also includes a means to deliver vapor to the target semiconductor. Thus, in one embodiment, vapor source 31 is in fluid communication with the semiconductor. In one preferred embodiment an inlet 32 provides fluid access from the exterior to the interior of vapor source 31, and an outlet 33 provides fluid access from the interior to the exterior of vapor source 31. Water 34 (or deuterium oxide) in liquid form may be disposed within vapor source. Water vapor (or the gas of deuterium oxide) may also be present in vapor source 31.

In a preferred embodiment vapor source 31 is connected to passivation vessel 37 through a fluid connection 36. One kind of fluid connection is a tubing or conduit. Fluid connection 36 provides a passage for the travel of vapor from vapor source 31 into and through vessel 37. In a preferred embodiment, fluid connection 36 connects outlet 33 of vapor source 31 to an ingress (not shown) on vessel 37.

Vessel 37 defines a chamber or space. In one embodiment vessel 37 is a quartz tube of the kind used in semiconductor fabrication. Vessel 37 is preferably of sufficient dimension to allow a semiconductor, or semiconductor wafer 38, to be positioned therein. As illustrated in FIG. 3 a rack 40 holds a number of semiconductor wafers in the interior of vessel 37 in a given position such as a generally vertical orientation as illustrated. In this manner, more than one wafer can be treated in a single processing step. Heating means 39 such as heating coils are disposed around vessel 37. Vessel 37 preferably includes an ingress (not shown) that allows fluid communication with the interior thereof. Vapor may thus enter vessel 37 through the ingress. Vessel 37 may include an exit or egress (not shown) for vapors to exit from the interior of the vessel.

Having described the invention from a structural standpoint, a method and manner of using the invention will now be described.

In operation, a heating means heats the fluid 34 (water or deuterium oxide) within vapor source 31. The heating of the fluid 34 vaporizes a portion of the fluid. The vapor creates a supersaturated or nearly supersaturated environment in the gas atmosphere 35 above the fluid.

A carrier gas such as oxygen ($O_2$), air, or argon may pass through inlet 32 into the interior of vapor source 31. The carrier gas thereupon "bubbles" through the liquid 34 and rises into the gas atmosphere 35 within vapor source 31. The carrier gas thereupon exits vapor source 31 through outlet 33. The rate of flow of the carrier gas is calibrated so that the fluid vapor within vapor source 31 is in a supersaturated state, or near supersaturated state, with respect to the fluid. Likewise heat transfer to vapor source 31 can be adjusted to provide a supersaturated, or nearly supersaturated vapor in the bubbler.

The carrier gas, now intermixed with vapor, exits vapor source 31 through outlet 33 and passes through conduit 36 to vessel 37. Vessel 37 meanwhile has been heated by heating means 39. Preferably the temperature within vessel 37 is held at a steady temperature between approximately 230° C. and 400° C. The temperature may correspond to the ambient temperature within the vessel such that the structure is heated at that temperature. The vapor that has been introduced into vessel 37 impinges on semiconductor wafers 38 placed therein. Any excess pressure within vessel 37 is allowed to escape through an exit or egress. The atmosphere that enters vessel and exits vessel is controlled so that the annealing vapor is present within vessel 37. The annealing vapor remains present within vessel 37 for a time period sufficient to affect annealing or the semiconductor structure. Preferably this time period is between approximately 5 minutes and approximately 120 minutes. Further, the heat transfer and mass transfer is controlled so that the vapor present within vessel 37 is in a supersaturated or near supersaturated condition.

In an alternative embodiment, vessel 37 is placed in a furnace. Thus, vessel 37 is heated to a desired temperature by the furnace. In this embodiment, heating means 39 need not be present. An industrial-type quartz tube furnace is acceptable, such as a Thermco MaxiBrute Furnace.

In one preferred embodiment, the vapor passivation method described herein is one manufacturing step in a larger process used to manufacture semiconductor chips in wafer form. The passivation method (or annealing step) may be practiced at any time during manufacture. It is preferred, however, that the annealing step take place before a gate metal deposition step. It is also preferred that the passivation step follow the ohmic contact formation step.

At several points in the process heating steps have been described. It is generally preferred that the rate of heating be gradual and uniform. Likewise, upon completion of the annealing step it is generally preferred that heat be removed and that materials be allowed to cool at a gradual rate to ambient temperature, or to a temperature suited for the next processing step.

In further processing of the semiconductor structure, it may receive other materials of the kind used to create an electronic device such as a transistor. For example, other steps may include forming a layer of gate material, especially on the dielectric stack. Any of the layers may also be patterned to form a gate of a transistor.

Figure 4:
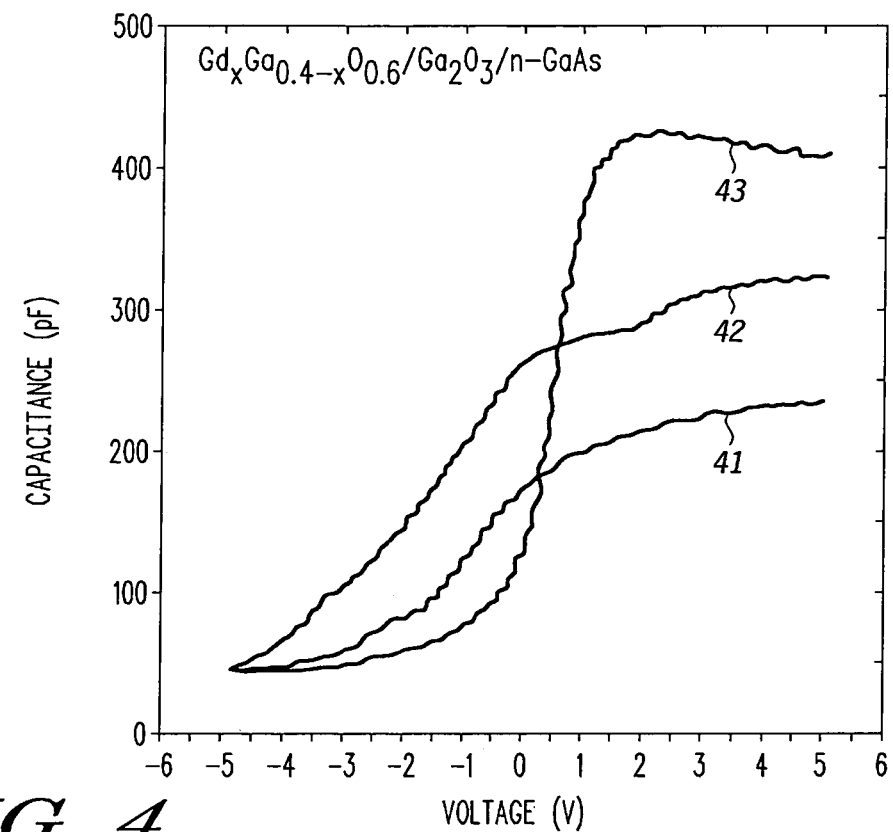
FIG. 4 is a graphical illustration of capacitance/voltage curves for MOS structures receiving differing passivation treatments according to an embodiment of the invention.

Referring now to FIG. 4 there is shown a graphical illustration of the effects of water vapor passivation as illustrated by capacitance-voltage data. FIG. 4 includes three curves. In each case the data is taken from a MOS structure comprising a $GdGaO/Ga_2O_3$/n-GaAs composition. Curve 41 corresponds to data taken from the MOS structure in an as deposited state, material that was not subject to a passivation step. Curve 42 corresponds to data taken from semiconductor material treated with dry hydrogen. Curve 43 corresponds to data taken from semiconductor material treated according to the water vapor method described herein. Curve 43, which displays a desirable MOS capacitance-voltage curve as voltage transitions from negative values to positive values, indicates an improvement in the trap density of the MOS structure. This improvement is attributable to the advantage that results from the water vapor passivation.

Figure 5:
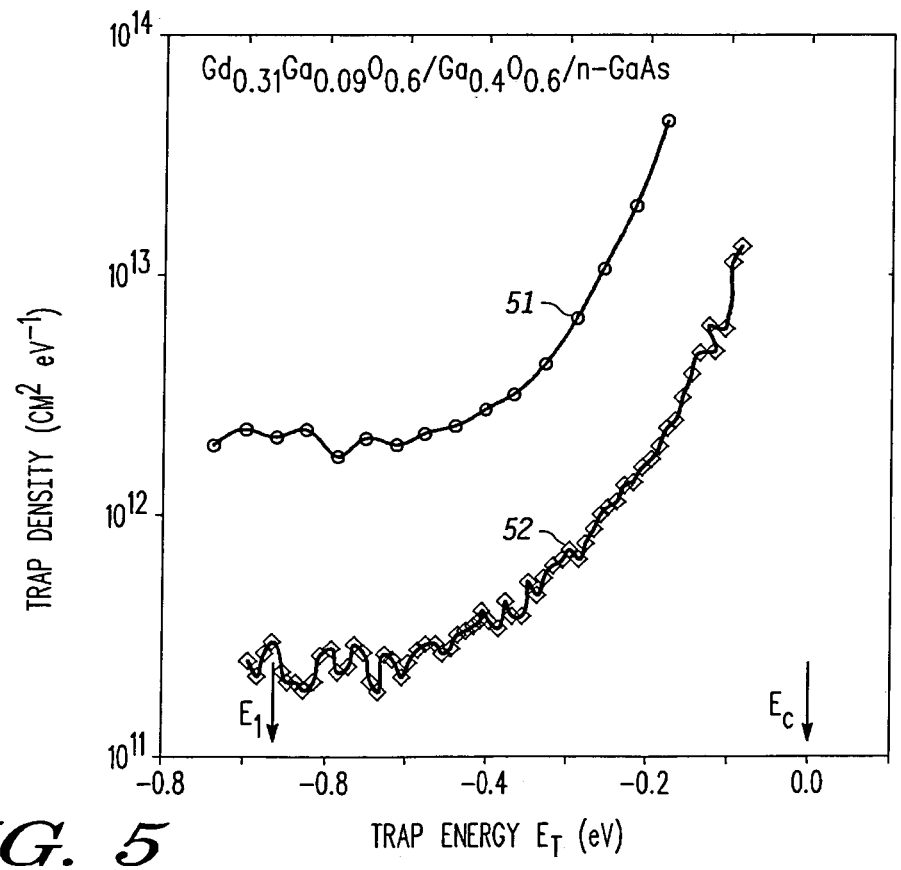
FIG. 5 is a graphical illustration of data showing the decrease in trap density in MOS structures after treatment with a passivation method according to an embodiment of the present invention.

Referring now to FIG. 5 there is shown a further graphical illustration of the improvement that may be realized through the methods of the present invention. FIG. 5 provides a graphical plot of the trap density against trap energy. It is generally desired to produce MOS structures with lower trap density. Curve 1, designated by reference no. 51, illustrates the trap density/energy data in MOS structures in an as deposited state. Generally positioned below curve 1 is curve 2 (reference 52). The data in curve 2 illustrate the improved trap density/energy data in MOS structures after receiving a vapor passivation treatment. The data for reference 52 are taken from a MOS semiconductor structure formed between $Gd_{0.31}Ga_{0.09}O_{0.6}/Ga_{0.4}O_{0.6}$/n-GaAs in which water vapor had been used to passivate the material. The data illustrate that the MOS structure receiving the water vapor passivation displays trap density/energy that is approximately an order of magnitude improved over the as deposited condition. Further the treated MOS structure displays trap density that is adequate for device applications.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for passivating oxide-semiconductor materials comprising the steps of:
   providing a semiconductor structure comprising a III-V material on a gallium oxide based dielectric material over the III-V material, wherein the structure comprises an epitaxial layer disposed on a III-V substrate and the gallium oxide based dielectric material is a dielectric stack disposed on top of the epitaxial layer;
   heating the semiconductor structure; and
   exposing the semiconductor structure to a vapor of water or deuterium oxide or water and deuterium oxide.

2. The method according to claim 1 wherein the dielectric stack is disposed on top of the epitaxial layer.

3. The method according to claim 1 further comprising the steps of forming a layer of gate metal over the dielectric stack.

4. The method according to claim 1 further comprising the step of exposing the semiconductor structure for a time period of between about 5 minutes to about 120 minutes.

5. The method according to claim 4 wherein the time of exposure is between about 20 to about 40 minutes.

6. The method according to claim 1 wherein the heating step heats the semiconductor structure at a temperature of between about 230° C. to about 400° C.

7. The method according to claim 6 wherein the heating step heats the semiconductor structure at a temperature of between about 270° C. to about 320° C.

8. A method of passivating a deposited oxide compound III-V semiconductor interface comprising the steps of:
   heating a source of liquid water or deuterium oxide so as to boil the liquid;
   transferring vapor of water or deuterium oxide to a vessel;
   heating a semiconductor material in a vessel at a temperature between approximately 230° C. and approximately 400° C., the semiconductor material comprising a III-V material and a gallium oxide based dielectric material over the III-V material; and
   exposing the semiconductor material to the vapor for a time of between about 5 to about 120 minutes.

9. The method according to claim 8 wherein the step of heating a source of liquid water or deuterium oxide further comprises beating the water or deuterium oxide in a bubbler.

10. The method according to claim 8 wherein the step of heating a semiconductor material further comprises heating a semiconductor material in a furnace.

11. The method according to claim 8 wherein the step of heating a semiconductor material further comprises use of heating coils disposed in proximity to the vessel.

12. The method according to claim 8 wherein the vessel comprises a quartz tube.

13. The method according to claim 8 wherein the step of heating a semiconductor material comprises heating the semiconductor material at a temperature of between about 270° C. to about 320° C.

14. The method according to claim 8 wherein the step of exposing the semiconductor material further comprises exposing the semiconductor material for a time of between about 20 to about 40 minutes.

15. The method according to claim 8 wherein the step of transferring vapor further comprises transferring the vapor from the bubbler to the vessel through a tube.

16. The method according to claim 15 further comprising transferring the vapor through a tube with a carrier gas.

17. A method for passivating a gate oxide on a III-V compound semiconductor substrate comprising the steps of:
   providing a multilayer semiconductor structure comprising a III-V substrate, an epitaxial layer deposited on one side of the III-V substrate, and a gallate/gallium oxide layer on one side of the epitaxial layer;
   heating the semiconductor structure at a temperature of between about 230° C. to about 400° C.; and
   exposing the semiconductor structure to a vapor of water or deuterium oxide or water and deuterium oxide for a time of between about 5 minutes to about 120 minutes.

18. The method according to claim 17 wherein the gallate/gallium oxide layer comprises a $GdGaO/Ga_2O_3$ dielectric stack wherein the gallate compound may have gadolinium and gallium in differing stoichiometries.

19. The method according to claim 17 wherein the step of exposing the semiconductor structure to vapor further comprises exposing the semiconductor structure to air that is saturated with vapor of water or deuterium oxide.

* * * * *

UNITED STATES PATENT AND TRADEMARK OFFICE
CERTIFICATE OF CORRECTION

PATENT NO. : 7,202,182 B2  Page 1 of 1
APPLICATION NO. : 10/882482
DATED : April 10, 2007
INVENTOR(S) : Passlack et al.

It is certified that error appears in the above-identified patent and that said Letters Patent is hereby corrected as shown below:

In the (57) Abstract, line 7, "230° C." should be changed to --230° C--;

Column 7, line 29, "230° C." should be changed to --230° C--;

Column 7, line 32, "270° C." should be changed to --270° C--;

Column 7, line 39, "230° C." should be changed to --230° C--;

Column 7, line 40, "400° C." should be changed to --400° C--;

Column 8, line 14, "270° C." should be changed to --270° C--; and

Column 8, line 33, "230° C. to about 400° C." should be changed to --230° C to about 400° C;--.

Signed and Sealed this

Fifth Day of June, 2007

JON W. DUDAS
*Director of the United States Patent and Trademark Office*